United States Patent [19]

Keller et al.

[11] Patent Number: 5,891,790
[45] Date of Patent: Apr. 6, 1999

[54] METHOD FOR THE GROWTH OF P-TYPE GALLIUM NITRIDE AND ITS ALLOYS

[75] Inventors: Stacia Keller; Peter Kozodoy, both of Goleta; Umesh K. Mishra, Santa Barbara; Steven P. Denbaars, Goleta, all of Calif.

[73] Assignee: The Regents of the University of California, Oakland, Calif.

[21] Appl. No.: 877,254

[22] Filed: Jun. 17, 1997

[51] Int. Cl.$^6$ .................................................. H01L 33/00
[52] U.S. Cl. ........................ 438/508; 438/507; 438/509
[58] Field of Search ................................... 488/507, 508, 488/509, 45, 46; 257/190; 372/44

[56] References Cited

U.S. PATENT DOCUMENTS

| | | |
|---|---|---|
| 5,168,077 | 12/1992 | Ashizawa et al. . |
| 5,210,051 | 5/1993 | Carter, Jr. . |
| 5,247,533 | 9/1993 | Okazaki et al. . |
| 5,278,433 | 1/1994 | Manabe et al. . |
| 5,281,830 | 1/1994 | Kotaki et al. . |
| 5,369,289 | 11/1994 | Tamaki et al. . |
| 5,496,766 | 3/1996 | Amano et al. ........................... 438/29 |
| 5,523,589 | 6/1996 | Edmond et al. . |
| 5,657,335 | 8/1997 | Rubin et al. .............................. 372/44 |
| 5,689,123 | 11/1997 | Major et al. ............................ 257/190 |

OTHER PUBLICATIONS

C.J. eiting, et al., Growth of Low Resistivity P–Type GaN by Metal Organic Chemical Vapour Deposition, Electronics Letters, vol. 33, No. 23, pp. 1987–1989, Nov. 6, 1997.

Lisa Suigiura, et al., P–Type Conduction in As–Grown Mg–Doped GaN Grown by Metalorganic Chemical Vapor Deposition, Applied Physics Letter, vol. 72, No. 14, pp. 1748–1750, Apr. 6, 1998.

*Primary Examiner*—Charles Bowers
*Assistant Examiner*—Keith Christianson
*Attorney, Agent, or Firm*—Merchant, Gould, Smith, Edell, Welter & Schmidt

[57] ABSTRACT

Growth of doped gallium nitride, especially p-type gallium nitride, without using post-growth processing is achieved by eliminating hydrogen containing molecules from the growth process before cooling down the substrate. Rapid cooling of the substrate with nitrogen gas prevents the reaction of p-type dopant atoms with hydrogen, and the use of the nitrogen gas also keeps the nitrogen intact within the crystalline structure.

9 Claims, 2 Drawing Sheets

METHOD FOR THE GROWTH OF P-TYPE GALLIUM NITRIDE AND ITS ALLOYS

STATEMENT AS TO RIGHTS TO INVENTIONS MADE UNDER FEDERALLY SPONSORED RESEARCH AND DEVELOPMENT

This invention was made with Government Support under Grant No. DMR 91-23048, awarded by the National Science Foundation. The Government has certain rights in this invention.

BACKGROUND OF THE INVENTION

1. Field of the Invention.

P-type GaN is a valuable electronic material. This invention relates in general to a method for growing a semiconductor material, and more particularly to a method for growing p-type GaN.

2. Description of Related Art.

In the field of electronics, new materials are being used to perform previously unobtainable goals, e.g., new devices, smaller devices, and more efficient devices. The ability to grow or otherwise manufacture these new materials has been limited by the understanding of the chemistry that is occurring, the need for the finished devices, and the ability to mass produce such devices.

The devices result from different areas of study. The first area is the ability to actually grow the material onto a substrate. Several different types of growth techniques have been approached for various materials. The second area is the ability to process those materials once they are grown onto a substrate. Many materials that are now in their infancy take their growth and processing techniques from more established materials, e.g., silicon, gallium arsenide, and others.

The Group III (Al, Ga, In) nitrides are materials that are producing devices previously unavailable in the electronics market. The alloy system (Al, Ga, In)N allows the fabrication of semiconductor materials thatemit light in the wavelength range from 200 to 700 nm, covering the entire range of visible light. These diodes cannot be made with any other materials currently known.

These advances in the ability of a material to produce luminescence in those optical regions allow for the use of the electronics to take the place of typical lighting fixtures. Further, the use of blue and UV diodes in the recording industry for the recording of CD-ROMs instead of the red/infared lasers (800 nm) currently being used in that industry allow for a up to four times higher density of information per unit distance on a CD-ROM track. Production of Light Emitting Diodes (LEDs) which use a lens shaped protective cover allow for high intensity light at low power levels.

However, gallium nitride films are hard to grow and process. Further, doped gallium nitride, especially gallium nitride that is doped with a p-type dopant, requires post-growth processing to achieve acceptable levels of active dopant atoms within the crystalline structure. The post-growth processing damages the gallium nitride crystalline structure and thereby degrades the overall properties of the material.

It can seen then that there is a need for producing gallium nitride films with better overall properties. It can also be seen that there is a need for producing gallium nitride films with p-type dopants that do not require post-growth processes. It can also be seen that there is a need for producing gallium nitride films at a lower cost.

SUMMARY OF THE INVENTION

To minimize the limitations in the prior art described above, and to minimize other limitations that will become apparent upon reading and understanding the present specification, the present invention discloses a powerful and highly productive method for creating p-type gallium nitride. The present invention is comprehensive and fully integrable with current processing techniques.

The present invention solves the above-described problems by providing a method for growing doped gallium nitride without using post-growth processing steps to activate the dopants. The method of the present invention reduces the amount of hydrogen introduced into the crystal structure by removing hydrogen from the growth process before the growth process stops. This reduces the need to perform thermal or electron beam treatments after the growth of the gallium nitride film.

A method in accordance with the principles of the present invention comprises the steps of placing a substrate into a chamber and heating the substrate. After the substrate pretreatment, a dopant gas typically trimethyl gallium, along with materials to grow the gallium nitride, typically ammonia, are introduced into the chamber. Any hydrogen containing gas is then turned off prior to cooling the substrate.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

Overview

Gallium nitride (GaN) films are currently being grown using a variety of growth techniques, including molecular beam epitaxy (MBE) and metal-organic chemical vapor deposition (MOCVD). However, p-doped GaN films grown by MOCVD are typically processed after the growth step to activate the p-type dopants within the crystal structure.

The post-growth treatments include low energy electron beam irradiation (LEEBI) and thermal cycling. These treatments supply energy to help break the hydrogen-dopant atom bond and aid in the diffusion of hydrogen from the crystalline structure of the deposited GaN film. However, the crystal structure is inherently damaged by either treatment.

The present invention proposes a method for activating the p-type dopants during the growth phase, in order to avoid crystal damage, resulting in better quality p-type GaN films. Further, the present invention allows for the growth of a GaN alloy film with boron, indium, aluminum, phosphorous, and arsenic in the same fashion, which will produce better quality GaN alloy films as well.

Detailed Drawings

Figure 1:
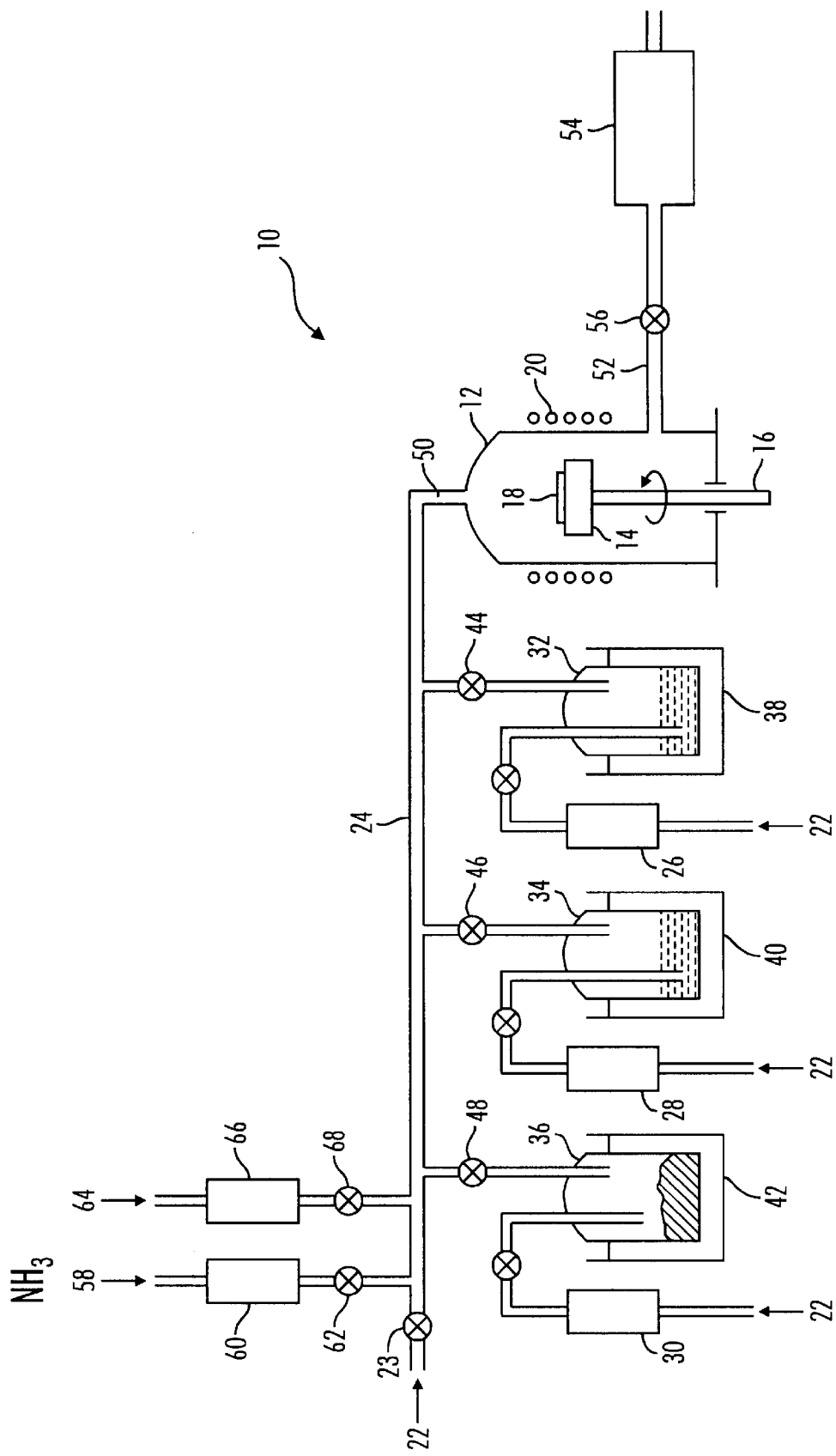
FIG. 1 schematically shows the construction of an MOCVD apparatus used in the present invention.

FIG. 1 schematially shows the construction of an MOCVD apparatus 10 used in the present invention. The apparatus 10 comprises a reaction vessel 12. A susceptor 14, typically made of graphite but can be made of other materials, is supported by a rotary shaft 16, is housed within the reaction vessel 12. A single crystal substrate 18 is disposed on the susceptor 14. The substrate 18 is typically sapphire, but can be other materials such as spinel, silicon carbide, zinc oxide, sioicon, gallium arsenide, and bulk gallium nitride.

The susceptor 14 is heated by a heater 20 to maintain the substrate 18 at a predetermined temperature. The temperature is typically between 800 and 1100 degrees centigrade, but can be higher or lower depending on the type of growth desired. The heater 20 may be a high frequency coil, but can be other devices.

A carrier gas 22 is supplied to a gas line 24. The carrier gas 22 is typically hydrogen or nitrogen, but can be other gases. The carrier gas 22 is also supplied through mass flow controllers 26, 28, and 30 to each of bubblers 32, 34, and 36. Bubbler 32 has a growth compound, typically an alkylated compound having a methyl group, e.g., trimethyl gallium (TMG), trimethyl aluminum (TMA) or trimethyl indium (TMI), housed therein. Bubblers 34 and 36 may also have a similar methyl group compound housed within to be able to grow an alloy of a Group III compound, e.g., gallium indium nitride, where bubbler 32 has TMG housed within it and bubbler 34 has TMI housed within it.

The bubblers 32, 34, and 36 are typically maintained at a predetermined temperature by constant temperature baths 38, 40, and 42. The temperature baths 38–42 are used to ensure a constant vapor pressure of the metal organic compound before it is carried to the reaction vessel 12 by the carrier gas 22.

The carrier gas 22 passes through bubblers 32, 34, and 36 is mixed with the carrier gas 22 stream flowing within the gas line 24 by opening appropriate valve 44, 46, and/or 48. The mixed gas is then introduced into the reaction vessel 12 through a gas inlet port 50 formed at the upper end of the reaction vessel 12. The gas within the reaction vessel 12 is discharged through a gas discharge pipeline 52 connected to a pump 54 operable under hydraulic pressure. Further, a valve 56 is interposed in the gas discharge pipeline 52 to allow gas pressure to build up or be bled off from the reaction vessel 12.

Elemental nitrogen containing gas 58 is supplied to the gas line 24 through mass flow controller 60 and the flow of elemental nitrogen containing gas 58 is controlled by valve 62. Elemental nitrogen containing gas is typically ammonia, but can be other materials. If the carrier gas 22 is mixed with the elemental nitrogen containing gas 58 and the TMG vapor within the gas line 24 and then introduced into the reaction vessel 12, the elements are present to grow gallium nitride on the substrate 18 through thermal decomposition of the molecules present in the TMG and elemental nitrogen.

To dope alloys of gallium nitride on the substrate 18, one of the bubblers 32, 34, or 36 not being used for the TMG is used for a dopant material, also known as a dopant precursor. Another bubbler 34, 36 is used for an alloy material, which is typically boron, aluminum, indium, phosphorous, and arsenic, but can be other materials. The dopant material is typically Magnesium (Mg), but can be other materials such as beryllium, calcium, zinc, silicon, and carbon. For example, if the TMG is present in bubbler 32, bubbler 34 can be used for cyclopentadienyl magnesium ($Cp_2Mg$) to dope the gallium nitride with magnesium, and bubbler 36 can be used for TMI to alloy the doped gallium nitride with indium.

Once the dopant and alloy are selected and the valve 44, 46, or 48 is opened to allow the dopant to flow into gas line 24 with the gallium and elemental nitrogen containing gas 58, the growth of a doped layer of gallium nitride takes place on substrate 18. To stop the growth, typical growth processes shut off the flow of the gallium from bubbler 32 and the dopant from bubbler 34 by closing valves 44 and 46, and then keep the nitrogen containing gas and the carrier gas flowing, or purge the reaction vessel 12 with a gas 64. Gas 64 can be controlled through mass flow controller 66 and valve 68. The purge is aided by opening valve 56 to allow the pump 54 to evacuate the reaction vessel 12 of excess growth material molecules. Typically, the purge gas 64 is hydrogen, but can be other gasses. The substrate 18 is then cooled by turning off the power to heater 20.

The present invention uses a different process to stop the growth of the doped gallium nitride film. Instead of just shutting off the source of the gallium and the dopant atoms, valves 23 and 62 are closed to shut off the flow of all of the gasses containing hydrogen from entering the reaction vessel 12. The reaction vessel 12 is then purged with the purge gas 64, in this case nitrogen, by opening valve 68. It is significant that nitrogen is used to avoid the presence of hydrogen in the reaction vessel 12. Valve 68 is opened up to allow a large flow of gas 68, and heater 20 is turned off. The large flow of gas 64 helps to cool the substrate 18 rapidly, typically at 300 degrees centigrade per minute, but faster or slower rates can be achieved.

By removing the sources of hydrogen atoms present during the growth processes, the resulting doped film grown on substrate 18 has fewer hydrogen atoms bonding to the dopant atoms within the crystalline structure. This lack of hydrogen produces a film that exhibits better electrical and optical qualities, because the dopant atoms can contribute holes to conduction and the hydrogen does not interfere with the optical properties.

Figure 2:
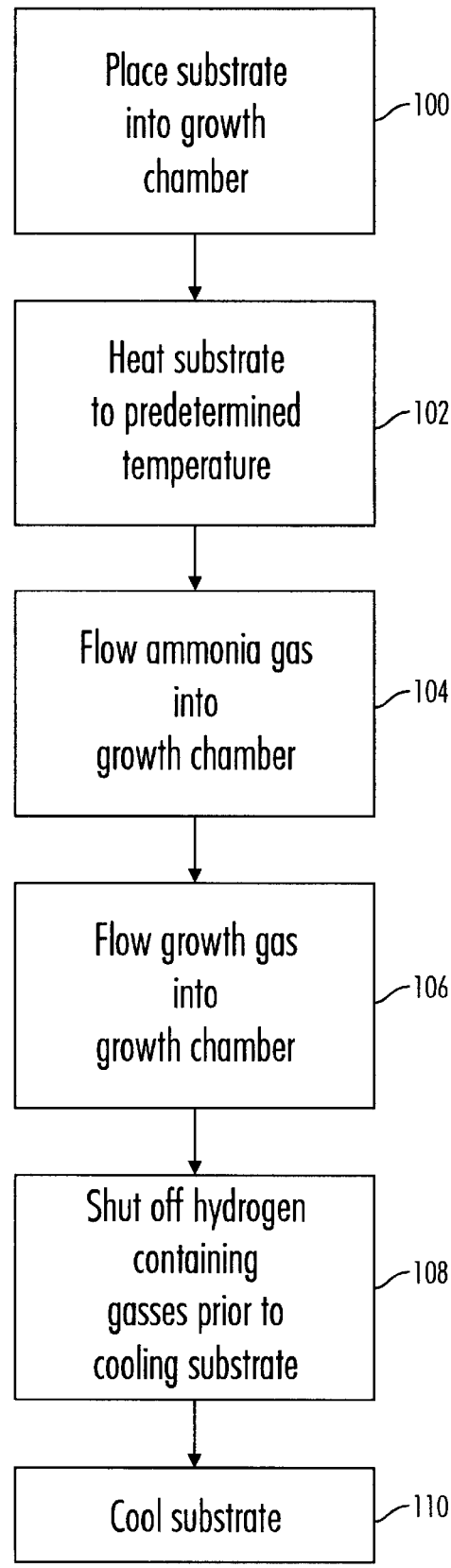
FIG. 2 is a flow chart showing the steps used in the present invention.

FIG. 2 is a flow chart showing the steps used in the present invention.

Block 100 represents placing a substrate into a growth chamber or reaction vessel.

Block 102 represents heating the substrate to a predetermined temperature. The temperature is typically 800 to 1100 degrees centigrade, but can be higher or lower.

Block 104 represents flowing elemental nitrogen containing gas, typically ammonia, into the chamber.

Block 106 represents flowing at least one growth gas into the chamber for growing a layer on the substrate. The growth gas is typically a carrier gas bubbled through a metal organic compound, such as TMG or TMI.

Block 108 represents shutting off the flow of all hydrogen containing gasses, typically the ammonia gas, the growth gas, and any carrier hydrogen gas, while the chamber is still heated (prior to cooling the substrate).

Block 110 represents cooling the substrate.

General Considerations

In general, the present invention provides a method for growing high quality p-type gallium nitride and gallium nitride alloys. Further, the invention provides a method of growing the film without using any post-growth processing steps.

The production of these films without post-growth steps reduces the damage done to the crystal before final devices are made, thus making final devices of higher optical and electrical quality. Making doped gallium nitride films without post-growth processing has not been performed in the prior art. This method of electronic device production is easier to produce than current methods.

In the description of the preferred embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The foregoing description of the preferred embodiment of the invention has been presented for the purposes of illustration and description. It is not intended to be exhaustive or to limit the invention to the precise form disclosed. Many modifications and variations are possible in light of the above description. It is intended that the scope of the invention be limited not with this detailed description, but rather by the claims appended hereto.

What is claimed is:

1. A method for growing a semiconductor material, comprising the steps of:

placing a substrate in a chamber;

heating the substrate to a predetermined temperature;

flowing elemental nitrogen containing gas into the chamber;

flowing at least one growth gas into the chamber for growing a layer on the substrate;

shutting off the flow of all hydrogen containing gases while the chamber is still heated; and cooling the substrate.

2. The method of claim 1, wherein the cooling step comprises flowing a non-hydrogen containing gas over the substrate.

3. The method of claim 1, wherein the semiconductor material is selected from a group comprising p-type gallium nitride, p-type gallium nitride alloyed with aluminum, p-type gallium nitride alloyed with indium, and p-type gallium nitride alloyed with boron.

4. The method of claim 3, wherein a dopant for the p-type gallium nitride is selected from a group comprising:

magnesium, beryllium, calcium, zinc, silicon, and carbon.

5. The method of claim 1, wherein the growth gas contains at least one material selected from a group comprising:

gallium, boron, aluminum, indium, phosphorous, and arsenic.

6. The method of claim 1, wherein the substrate is cooled at 300 degrees centigrade per minute.

7. The method of claim 1, wherein the substrate is selected from a group comprising sapphire, spinel, silicon carbide, zinc oxide, silicon, gallium arsenide, and bulk gallium nitride.

8. The method of claim 1, wherein the growth gas is created by bubbling a gas through a material selected from a group comprising trimethyl gallium, trimethyl indium, and trimethyl aluminum.

9. The method of claim 1, wherein the elemental nitrogen containing gas is ammonia.

* * * * *

UNITED STATES PATENT AND TRADEMARK OFFICE
CERTIFICATE OF CORRECTION

PATENT NO. : 5,891,790
DATED : April 6, 1999
INVENTOR(S) : Stacia Keller et al.

It is certified that error appears in the above-identified patent and that said Letters Patent is hereby corrected as shown below:

[75] Inventors:

"Steven P. Denbaars" should read --Steven P. DenBaars--.

[56] OTHER PUBLICATIONS

"Lisa Suigiura, et al." should read --Lisa Sugiura, et al.--.

Signed and Sealed this

Seventeenth Day of July, 2001

*Attest:*

NICHOLAS P. GODICI
*Attesting Officer*     *Acting Director of the United States Patent and Trademark Office*